United States Patent
Ide

(10) Patent No.: US 7,302,019 B2
(45) Date of Patent: Nov. 27, 2007

(54) MAXIMUM LIKELIHOOD DECODING METHOD AND MAXIMUM LIKELIHOOD DECODER

(75) Inventor: Naoki Ide, Tokyo (JP)

(73) Assignee: Sony Corporation, Tokyo (JP)

( * ) Notice: Subject to any disclaimer, the term of this patent is extended or adjusted under 35 U.S.C. 154(b) by 791 days.

(21) Appl. No.: 10/610,931

(22) Filed: Jul. 2, 2003

(65) Prior Publication Data

US 2004/0064780 A1 Apr. 1, 2004

(30) Foreign Application Priority Data

Jul. 4, 2002 (JP) .............................. 2002-195906

(51) Int. Cl.
*H03D 1/00* (2006.01)
(52) U.S. Cl. ...................... 375/341; 714/794; 714/795; 369/53.16; 369/59.22; 369/275.2
(58) Field of Classification Search ................ 375/341, 375/263, 290, 291; 369/53.16, 59.22, 275.3; 714/794, 795
See application file for complete search history.

(56) References Cited

U.S. PATENT DOCUMENTS

| | | | | |
|---|---|---|---|---|
| 4,571,734 A | * | 2/1986 | Dolivo et al. ............... 375/291 |
| 5,961,658 A | * | 10/1999 | Reed et al. .................. 714/746 |
| 6,185,256 B1 | * | 2/2001 | Saito et al. .................. 375/257 |
| 6,445,662 B1 | * | 9/2002 | Tonami .................... 369/59.21 |
| 6,678,230 B2 | * | 1/2004 | Miyashita et al. ........ 369/53.16 |
| 6,724,555 B2 | * | 4/2004 | Ohta ............................ 360/65 |
| 6,914,867 B2 | * | 7/2005 | Tonami .................... 369/59.22 |
| 2001/0021153 A1 | * | 9/2001 | Taguchi et al. .......... 369/59.22 |
| 2003/0026185 A1 | * | 2/2003 | Fujiwara et al. ......... 369/53.15 |

* cited by examiner

*Primary Examiner*—Temesghen Ghebretinsae
*Assistant Examiner*—Juan Alberto Torres
(74) *Attorney, Agent, or Firm*—Oblon, Spivak, McCelland, Maier & Neustadt, P.C.

(57) ABSTRACT

A maximum likelihood decoder includes metric generators for generating metrics based on a plurality of partial responses and a Viterbi decoder for realizing maximum likelihood decoding by using a synthetic metric generated by synthesizing the metrics. A first partial response is an original partial response. A second partial response is a differential response generated by subtraction by shifting the first partial response by 1 clock. Alternatively, the differential response may be generated by subtraction by shifting the first partial response by 2 clocks. The second partial response may be a response generated by addition by shifting the first partial response by 2 clocks. Alternatively, the second partial response may be an integration response generated by adding all previous samples of the first partial response.

38 Claims, 13 Drawing Sheets

FIG. 8

METRIC REGISTER {

| | |
|---|---|
| $mp_{11111} = ms_{1111} + k \cdot mb_{11111}$ | 8P |
| $mp_{11110} = ms_{1111} + k \cdot mb_{11110}$ | 8O |
| $mp_{11100} = ms_{1110} + k \cdot mb_{11100}$ | 8N |
| $mp_{01111} = ms_{0111} + k \cdot mb_{01111}$ | 8M |
| $mp_{01110} = ms_{0111} + k \cdot mb_{01110}$ | 8L |
| $mp_{01100} = ms_{0110} + k \cdot mb_{01100}$ | 8K |
| $mp_{11001} = ms_{1100} + k \cdot mb_{11001}$ | 8J |
| $mp_{11000} = ms_{1100} + k \cdot mb_{11000}$ | 8I |
| $mp_{00111} = ms_{0011} + k \cdot mb_{00111}$ | 8H |
| $mp_{00110} = ms_{0011} + k \cdot mb_{00110}$ | 8G |
| $mp_{10011} = ms_{1001} + k \cdot mb_{10011}$ | 8F |
| $mp_{10001} = ms_{1000} + k \cdot mb_{10001}$ | 8E |
| $mp_{10000} = ms_{1000} + k \cdot mb_{10000}$ | 8D |
| $mp_{00011} = ms_{0001} + k \cdot mb_{00011}$ | 8C |
| $mp_{00001} = ms_{0000} + k \cdot mb_{00001}$ | 8B |
| $mp_{00000} = ms_{0000} + k \cdot mb_{00000}$ | 8A |

2D

ADD MEDIA NOISE

ADD SYSTEM NOISE

MAXIMUM LIKELIHOOD DECODING METHOD AND MAXIMUM LIKELIHOOD DECODER

BACKGROUND OF THE INVENTION

1. Field of the Invention

The present invention relates to a maximum likelihood decoding method and a maximum likelihood decoder for obtaining original information by decoding a reproduced signal reproduced from a recording medium or a signal obtained through a transmission medium. In particular, the present invention relates to a maximum likelihood decoding method and a maximum likelihood decoder applying partial response maximum likelihood decoding.

2. Description of the Related Art

In general, a reproducing apparatus used in a data recording/reproducing technique using various recoding media includes a pickup device for reading a signal recorded in a recording medium as a reproduced signal and a decoder for decoding the reproduced signal read by the pickup device so as to obtain original binary data.

Also, with an increase in the recording density in such a recording/reproducing technique, a partial response maximum likelihood (PRML) decoding method, which realizes high decoding reliability, has been adapted in decoders for decoding a reproduced signal so as to obtain original recorded data.

The PRML technique is realized by combining a partial response method, in which data sequences are associated with predetermined levels in units of bits, and a maximum likelihood decoding method, in which a data sequence is selected from among all possible data sequences so that a reference signal generated by a partial response becomes most approximate to an actual reproduced signal.

That is, in the partial response method, data sequences are compiled in units of sequential bits so as to associate a possible bit pattern to a reproduced-signal level.

For example, data is represented by $d_n$ and a sample generated by sampling a reproduced signal is represented by $r_n$. n is the number of data. In this case, $d_n$ corresponds to the input of partial response and $r_n$ corresponds to the output of partial response. In the partial response, four sequential bits are associated with the level of the reproduced signal.

In order to obtain the output of partial response, the input four sequential bits are added in order by multiplying the four bits by weights a, b, b, and a, respectively. This can be represented by the following equation.

$$r_n = ad_n + bd_{n+1} + bd_{n+2} + ad_{n+3} \quad (1)$$

This partial response is represented by PR (a b b a).

On the other hand, in the maximum likelihood decoding method, all possible data sequences are converted into reference signals of a reproduced signal through a predetermined partial response. Then, from among the reference signals, a reference signal that is the most approximate to a sample sequence of an actually detected reproduced signal is selected, and then the selected reference signal is decoded. Herein, the reference signals generated from the data sequences are ideal reproduced signals without noise.

The maximum likelihood decoding is an algorithm for selecting a reference signal that is the most likely to be an original reference signal from among all possible data sequences, in the condition that a detected reproduced signal sequences is a reference signal to which noise is added (conditional probability). The conditional probability is calculated based on a metric, which can be obtained by the following equation.

$$m_n = (\tilde{r}_n - r_n)^2 \quad (2)$$

Herein, $\tilde{r}_n$ is a sample value of a reproduced signal detected at time n, and $r_n$ is a sample value of a reference signal at time n.

In actual maximum likelihood decoding, the sum of metrics is obtained instead of the conditional probability, and a data sequence for minimizing the sum is output. Also, instead of calculating metrics of all data sequences, a data sequence is selected or not selected at each channel clock so as to determine a final data sequence. Such a data sequence searching algorithm is realized by a Viterbi algorithm.

The above-described PRML is effective for random noise. However, noise in a recording/reproducing channel includes not only random noise but also noise having a frequency characteristic. Accordingly, measures should be taken to control such noise.

FIG. 12 is a block diagram showing a recording/reproducing system of a known art and noise generated therefrom. As shown in FIG. 12, media noise is caused at a recording medium 12A and system noise is caused at a pickup 12B and a maximum likelihood decoder 12C. The noise caused in the recording/reproducing system includes two types of noise: the system noise and the media noise. Therefore, the following equation can be obtained.

$$N_{total} = N_{system} + N_{media} \quad (3)$$

Herein, $N_{total}$ represents total noise, $N_{system}$ represents system noise, and $N_{media}$ represents media noise.

The system noise is generated from noise caused by a detector, an electrical circuit, and deviation of the level of PRML, and is usually considered to be random noise. In the known PRML, decoding which is effective for such random noise can be realized.

On the other hand, the media noise is considered to be caused mainly by defects of a medium, crosstalk, and fluctuation of reflectivity. In general, media noise is different from system noise, and is added to a reproduced signal through a transmission medium having a frequency characteristic. Therefore, the media noise is random noise on media, but the media noise becomes noise having a frequency characteristic and a temporal correlation in a reproduced signal.

For example, when media noise passes through a system for realizing the above-described PR (a b b a), if the noise at an n-th channel bit on a medium is represented by $n_n$, noise $N_n$ in an n-th sample of a reproduced signal is represented by the following equation.

$$N_n = an_n + bn_{n+1} + bn_{n+2} + an_{n+3} \quad (4)$$

In this case, even if the media noise $n_n$ itself is random noise, that media noise in the reproduced signal has an emphasized low-frequency component.

FIGS. 13A and 13B show examples of the waveforms of a signal containing media noise and a signal containing system noise.

FIG. 13A shows a signal generated by adding the media noise represented by the equation (4) to the above-described equation (1). Also, FIG. 13B shows a signal generated by adding random noise to the equation (1). Herein, the SN ratio of media noise to a data signal is equal to the SN ratio of system noise to a reproduced signal. Also, an ideal signal without noise is indicated by a solid line.

By comparing the waveforms in FIGS. 13A and 13B, it can be found that the signal with media noise maintains the original state better than the signal with system noise. This is because the media noise becomes noise having a low-frequency and is virtually offset, and as a result, a relative level can be maintained.

In general, noise in a recording/reproducing system is temporarily correlated noise due to the frequency characteristic of the channel, and thus the signal waveform can be maintained relatively well compared to the case where random noise of the same S/N ratio exists.

However, the known PRML is effective to random noise, but is not so effective to offset noise. Also, even if noise has a frequency characteristic, the characteristic cannot be used positively.

That is, the known PRML is not the optimal decoding method in case noise has a frequency characteristic. Accordingly, a more appropriate decoding method is required to be developed for controlling noise with a frequency characteristic.

The noise which is obtained after processing of partial response PR (a b b a) having a characteristic of attenuating a high-frequency band has an emphasized low-frequency component, and thus the noise is offset. As a result, the signal level is relatively maintained, as described above.

Accordingly, a partial response having a frequency characteristic for attenuating a low-frequency band such as a differential waveform is proposed as a partial response in which relative levels can be compared.

If the partial response PR (a b b a) can be realized compared to the frequency characteristic in a step of transferring data, a partial response PR (a b−a 0 a−b −a), which is a differential response between the partial response PR (a b b a) and a response shifted by 1 clock, can also be realized.

Further, a reproduced signal generated by the PR (a b−a 0 a−b −a) can be represented by the following equation.

$$r_n = a(d_n - d_{n+4}) + (b-a)(d_{n+1} - d_{n+3}) \quad (5)$$

The response of the equation (5) is generated by subtraction by shifting the response of PR (a b b a) by 1 clock. Therefore, if the reproduced signal can be equalized to PR (a b b a), the reproduced signal can also be equalized to PR (a b−a 0 a−b −a).

Accordingly, by comparing the relative level of amplitude by using a partial response obtained as a temporal difference of the above-described partial response, more effective maximum likelihood decoding can be realized.

However, if the noise in an n-th sample of a reproduced signal is represented by Nn, the media noise $n_n$ obtained through partial response PR (a b−a 0 a−b −a) processing contributes like this:

$$N_n = a(n_n - n_{n+4}) + (b-a)(n_{n+1} - n_{n+3}) \quad (6)$$

Therefore, a higher frequency component is emphasized in the noise obtained through the partial response PR (a b−a 0 a−b −a), compared to the partial response PR (a b b a).

Also, by obtaining a difference, a high-frequency component of random noise is amplified. Therefore, maximum likelihood decoding using a partial response generated by using a temporal difference is not always more effective than maximum likelihood decoding using an original partial response. Accordingly, maximum likelihood decoding using an original partial response and maximum likelihood decoding using a partial response using a temporal difference are combined.

The followings are summary of the above-description.

(1) Noise caused in a recording/reproducing system includes random system noise and non-random media noise. Therefore, PRML which is effective for the non-random noise is required.

(2) In the original partial response, a low-frequency component of media noise is emphasized, and thus the noise in a reproduced signal has many low-frequency components.

(3) By obtaining a time difference of the original partial response, noise of a low-frequency component is attenuated, while noise of a high-frequency component is emphasized.

(4) Accordingly, by developing maximum likelihood decoding using both of the original partial response and the time-differential partial response, effects can be expected.

SUMMARY OF THE INVENTION

Accordingly, it is an object of the present invention to provide a maximum likelihood decoding method and a maximum likelihood decoder which can effectively solve a problem of noise in a recording/reproducing system, including random system noise and non-random media noise.

In order to achieve the above-described object, according to an aspect of the present invention, a maximum likelihood decoding method for obtaining original information by decoding a reproduced signal from a recording medium or a reproduced signal obtained through a transmission medium is provided. The method includes a first-metric generating step for generating a metric of a reproduced signal generated based on a first partial response, the metric being a first metric; a second-metric generating step for generating a metric of a reproduced signal generated based on a second partial response, the metric being a second metric; and a maximum likelihood decoding step for realizing maximum likelihood decoding by using the first metric and the second metric.

According to another aspect of the present invention, a maximum likelihood decoder for obtaining original information by decoding a reproduced signal from a recording medium or a reproduced signal obtained through a transmission medium is provided. The maximum likelihood decoder includes a first-metric generator for generating a metric of a reproduced signal generated based on a first partial response, the metric being a first metric; a second-metric generator for generating a metric of a reproduced signal generated based on a second partial response, the metric being a second metric; and a maximum likelihood decoding unit for realizing maximum likelihood decoding by using the first metric and the second metric.

In the maximum likelihood decoding method and the maximum likelihood decoder of the present invention, a metric between a reproduced signal generated based on a first predetermined response and a reference value generated based on the response is generated. Also, a metric between a reproduced signal generated based on a second predetermined response and a reference value generated based on the response is generated. By using a synthetic metric generated by combining these two metrics at a predetermined ratio, maximum likelihood decoding can be realized while effectively controlling various types of noise having different characteristics.

For example; the first partial response has a predetermined frequency characteristic which can be realized by adjusting a frequency characteristic of a channel for generating a reproduced signal based on a data signal. The first partial response is generated by equalizing a reproduced signal, which is reproduced by transferring a data signal, by using a waveform equalizer.

Also, the first-metric generator generates the first metric by calculating a metric between a reproduced signal generated by equalizing a reproduced data signal to the first partial response and a reference signal obtained by inputting a data sequence which can serve as a decoded data sequence to the first partial response.

On the other hand, the second partial response is a differential partial response obtained by calculating a difference between the first partial response and a response generated by shifting the first partial response by 1 channel clock.

The second-metric generator generates the second metric by calculating a metric between a reproduced signal generated by equalizing a reproduced data signal to the second partial response and a reference signal obtained by inputting a data sequence which can serve as a decoded data sequence to the second partial response.

Herein, the metric is the square, absolute value, or function of a difference in an amplitude level between a sample of a reproduced signal generated by reproducing a data signal based on a predetermined partial response and a sample of a reference signal generated by using a data signal which can serve as a decoded data signal based on the partial response.

Further, the maximum likelihood decoding unit includes a metric synthesizer for synthesizing the first metric and the second metric at a predetermined ratio; and a Viterbi decoder for obtaining original data by using the synthetic metric by maximum likelihood decoding. The ratio of the first metric and the second metric is adjusted in accordance with the frequency characteristic of noise contained in a reproduced signal reproduced by transferring a data signal.

The maximum likelihood decoding unit uses a Viterbi algorithm, and a data pattern representing states which form the Viterbi algorithm includes pieces of data whose number is the same as the number of pieces of data required for generating the first partial response.

Also, in order to specifically realize maximum likelihood decoding, a data pattern representing states which form the Viterbi algorithm includes pieces of data whose number is smaller by one than the number of pieces of data required for generating the second partial response. Alternatively, a data pattern representing states which form the Viterbi algorithm includes pieces of data whose number is the same as the number of pieces of data required for generating the second partial response.

Herein, the first metric is defined to each state of Viterbi decoding, and the second metric is defined to each branch of Viterbi decoding. Alternatively, the first metric and the second metric are defined to each branch of Viterbi decoding. Alternatively, the first metric is defined to each branch of Viterbi decoding, and the second metric is defined to each state of Viterbi decoding.

In the Viterbi decoding for realizing maximum likelihood decoding by setting the metrics, a survival path to each state has the smallest path metric in paths to each state. Also, the path metric of a path in each state can be obtained by multiplying a metric to the first predetermined response by a predetermined constant and then adding the result to the path metric of a survival path to each state. Further, the path metric of a path in each branch can be obtained by multiplying a metric to the second predetermined response by a predetermined constant and then adding the result to the path metric of a survival path to each branch.

With this configuration, by performing maximum likelihood decoding by using the synthetic metric generated by combining the two metrics at a predetermined ratio, maximum likelihood decoding for decoding data effectively at a low error rate can be realized, even if noise has a temporal correlation and a specific frequency characteristic.

BRIEF DESCRIPTION OF THE DRAWINGS

FIG. 8 is a block diagram showing an example of the configuration of a metric synthesizer in the maximum likelihood decoder shown in FIG. 2;

DESCRIPTION OF THE PREFERRED EMBODIMENTS

Hereinafter, an embodiment of a maximum likelihood decoding method and a maximum likelihood decoder according to the present invention will be described.

In the embodiment, a first metric is generated based on an original partial response and a second metric is generated based on a differential response of the original partial response. Then, the two metrics are combined at a predetermined ratio so as to perform maximum likelihood decoding.

That is, high-frequency media noise is attenuated by the original partial response. On the other hand, low-frequency media noise is attenuated by the time-differential partial response. Accordingly, by combining the two partial responses, maximum likelihood decoding can be realized while effectively attenuating high-frequency media noise and low-frequency media noise.

In the embodiment, maximum likelihood decoding is realized by using a synthetic metric generated by combining the first metric obtained from the original partial response and the second metric obtained from the time-differential partial response at a predetermined ratio. Therefore, data decoding can be performed more effectively than in the known art, while solving a problem of noise in a recording/reproducing system, the noise having a temporal correlation and a frequency characteristic.

Figure 1:
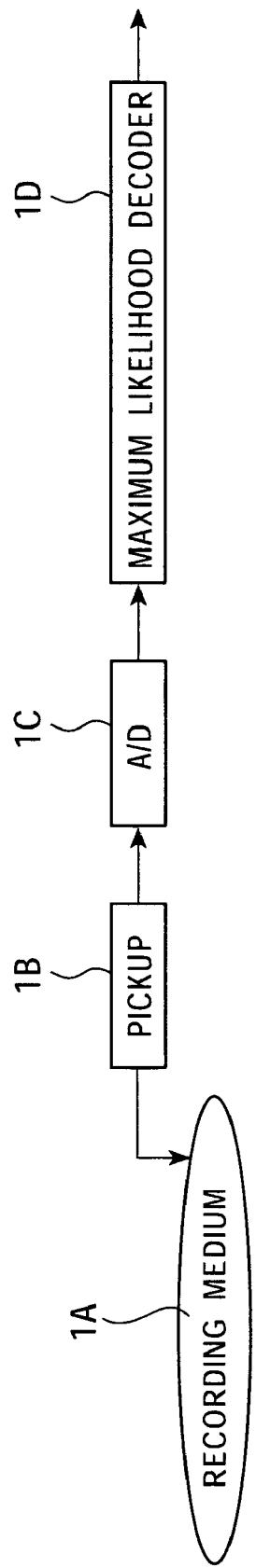
FIG. 1 is a block diagram showing the outline of a recorded-information reproducing apparatus to which a maximum likelihood decoding method of an embodiment of the present invention is applied.

FIG. 1 is a block diagram showing the overview of a recorded-information reproducing apparatus to which the maximum likelihood decoding method according to the embodiment of the present invention is applied.

The recorded-information reproducing apparatus includes a recording medium 1A containing information; a pickup 1B for reading a signal recorded in the recording medium 1A so as to obtain a reproduced signal; an AD converter 1C which AD-converts the reproduced signal read by the pickup 1B so as to sample the signal; and a maximum likelihood decoder 1D for decoding sample sequences of the reproduced signal obtained from the AD converter 1C so as to obtain data sequences.

Figure 2:
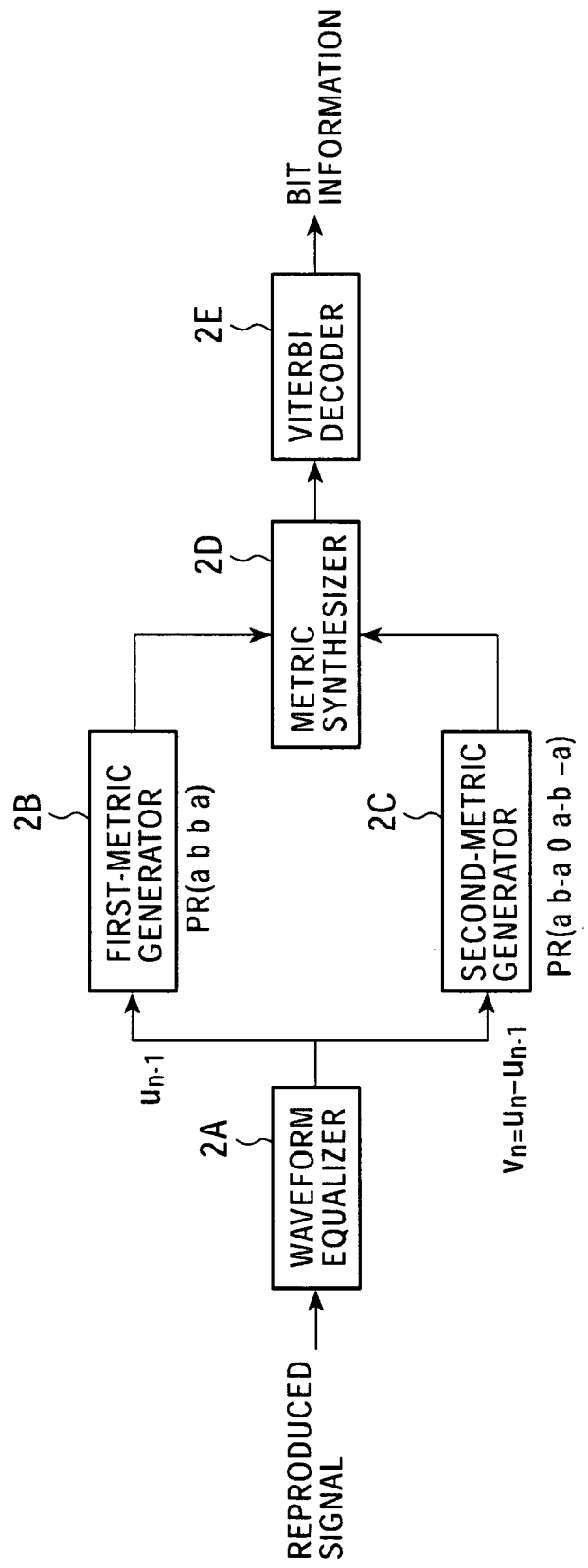
FIG. 2 is a block diagram showing an example of the configuration of a maximum likelihood decoder in the recorded-information reproducing apparatus shown in FIG. 1.

FIG. 2 is a block diagram showing an example of the configuration of the above-described maximum likelihood decoder 1D.

As shown in FIG. 2, the maximum likelihood decoder 1D includes a waveform equalizer 2A; a first-metric generator 2B; a second-metric generator 2C; a metric synthesizer 2D; and a Viterbi decoder 2E.

The reproduced signal input to the maximum likelihood decoder 1D is first input to the waveform equalizer 2A. The waveform equalizer 2A outputs an equalized signal $u_n$ which has been equalized to a predetermined target partial response PR (a b b a), and the equalized signal $u_n$ is input to the first-metric generator 2B and the second-metric generator 2C.

The first-metric generator 2B generates a first metric based on a first partial response and outputs the first metric.

The second-metric generator 2C generates a second metric based on a second partial response and outputs the second metric.

The metric synthesizer 2D receives the first metric output from the first-metric generator 2B and the second metric output from the second-metric generator 2C and combines the metrics at a predetermined ratio, so that a synthetic metric is output therefrom.

The synthetic metric output from the metric synthesizer 2D is input to the Viterbi decoder 2E, which decodes the synthetic metric by a Viterbi algorithm so as to output decoded bit data.

Figure 3:
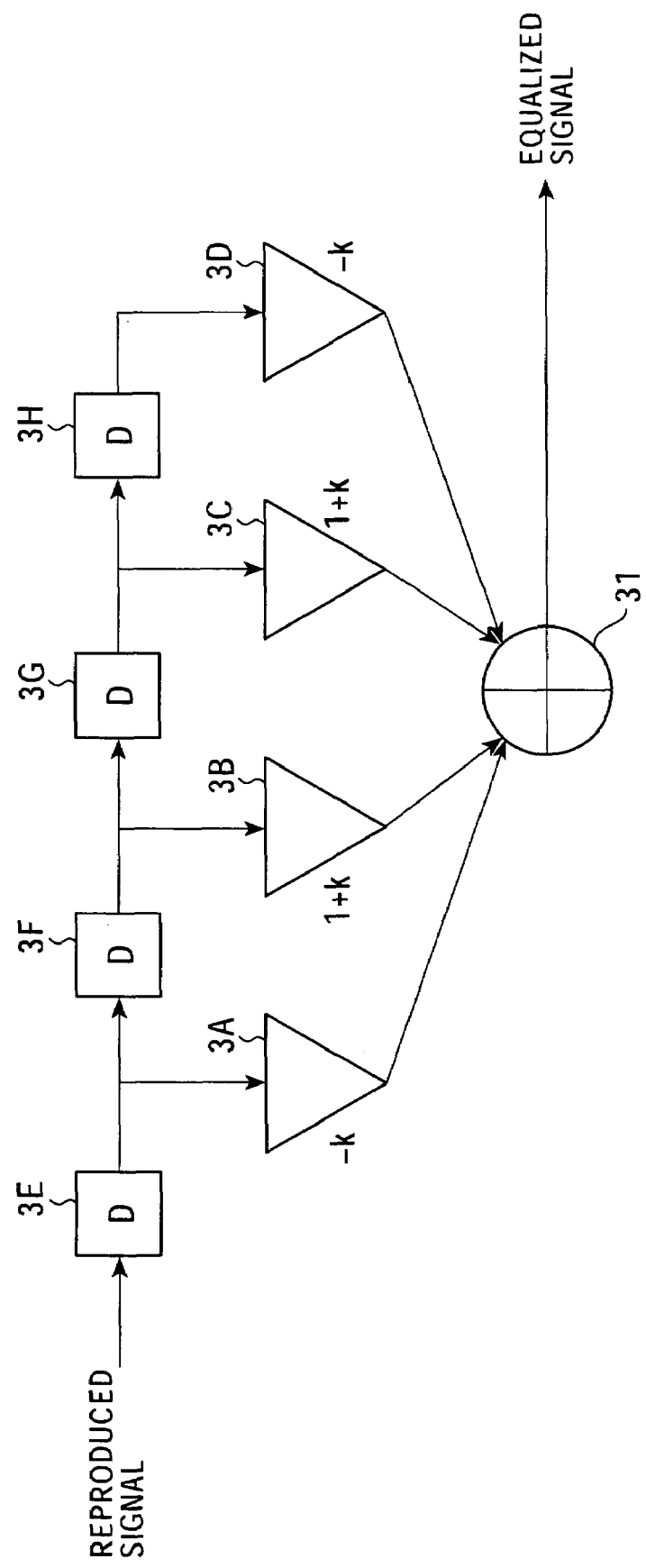
FIG. 3 is a block diagram showing an example of the configuration of a waveform equalizer in the maximum likelihood decoder shown in FIG. 2.

FIG. 3 is a block diagram showing an example of the configuration of the waveform equalizer 2A.

The waveform equalizer 2A serves as a filter including amplifiers 3A to 3D; flip-flops 3E to 3H; and an adder 31.

The reproduced signal input to the waveform equalizer 2A is delayed by 1 channel-clock by the flip-flop 3E, is further delayed by 1 clock by the flip-flop 3F, is further delayed by 1 clock by the flip-flop 3G, and is further delayed by 1 clock by the flip-flop 3H.

Further, the reproduced signal output from the flip-flop 3E is amplified to −k times by the amplifier 3A, the reproduced signal output from the flip-flop 3F is amplified to 1+k times by the amplifier 3B, the reproduced signal output from the flip-flop 3G is amplified to 1+k times by the amplifier 3C, and the reproduced signal output from the flip-flop 3H is amplified to −k times by the amplifier 3D.

The four reproduced signals are output from the amplifiers 3A to 3D, respectively, and are added by the adder 31. Further, the output from the adder 31 is output from the waveform equalizer 2A as an equalized signal.

Herein, k, which determines the coefficient of each of the amplifiers 3A to 3D, is adjusted so as to minimize the noise of the equalized signal.

Figure 4:
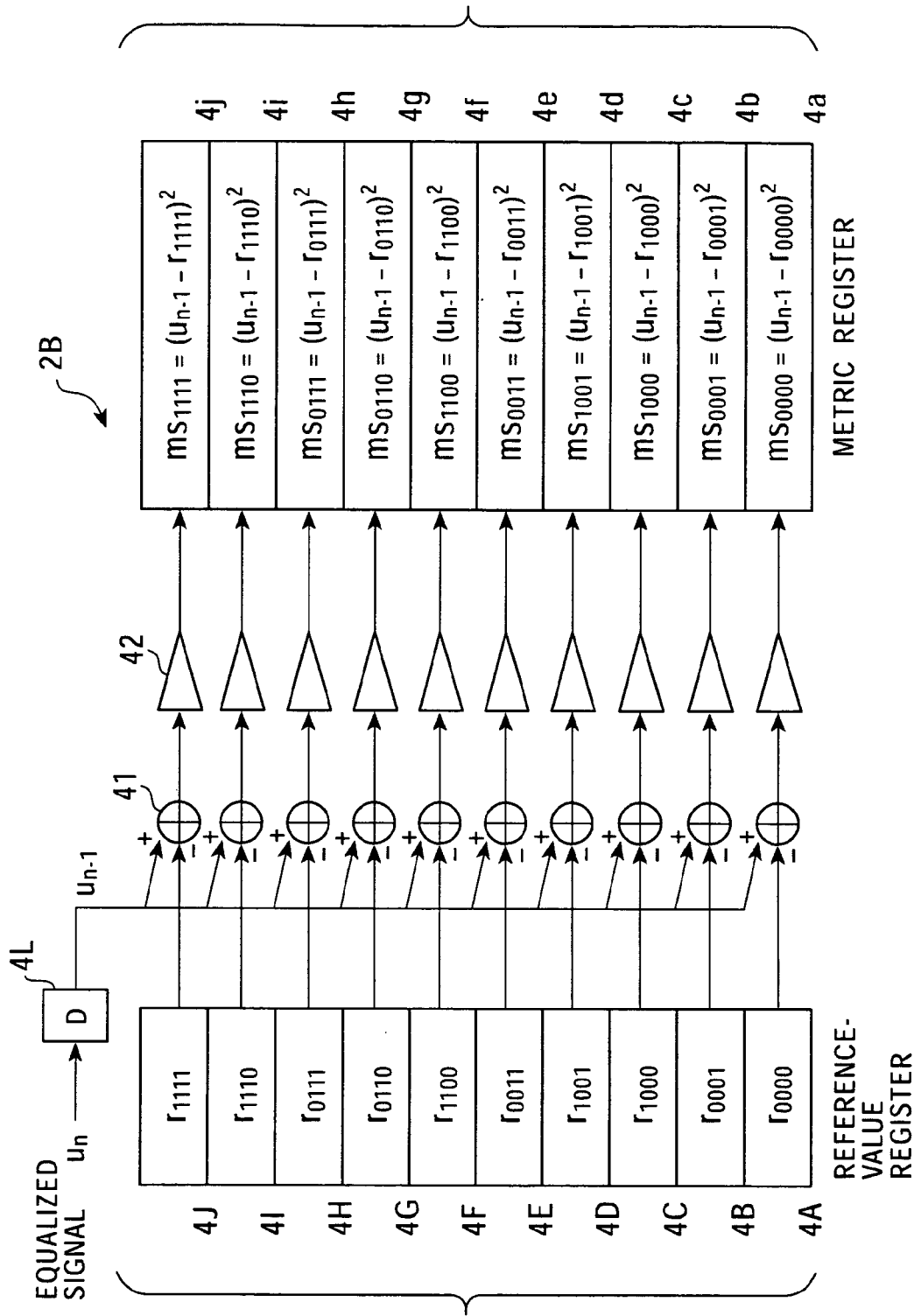
FIG. 4 is a block diagram showing an example of the configuration of a first-metric generator in the maximum likelihood decoder shown in FIG. 2.

FIG. 4 is a block diagram showing an example of the configuration of the first-metric generator 2B.

The first-metric generator 2B includes predicted sample value (reference value) registers 4A to 4J; metric registers 4a to 4j; and a flip-flop 4L.

The equalized signal $u_n$ input to the first-metric generator 2B is input to the flip-flop 4L, which delays the equalized signal $u_n$ by 1 channel clock so as to output an equalized signal $u_{n-1}$.

Also, the register 4A stores a reference value $r_{0000}$ corresponding to a data sequence 0000. The register 4B stores a reference value $r_{0001}$ corresponding to a data sequence 0001. The register 4C stores a reference value $r_{1000}$ corresponding to a data sequence 1000. The register 4D stores a reference value $r_{1001}$ corresponding to a data sequence 1001. The register 4E stores a reference value $r_{0011}$ corresponding to a data sequence 0011. The register 4F stores a reference value $r_{1100}$ corresponding to a data sequence 1100. The register 4G stores a reference value $r_{0110}$ corresponding to a data sequence 0110. The register 4H stores a reference value $r_{0111}$ corresponding to a data sequence 0111. The register 4I stores a reference value $r_{1110}$ corresponding to a data sequence 1110. The register 4J stores a reference value $r_{1111}$ corresponding to a data sequence 1111.

Further, a metric $ms_{0000}$ between the equalized signal $u_{n-1}$ and the reference value $r_{0000}$ is stored in the register 4a. A metric $ms_{0001}$ between the equalized signal $u_{n-1}$ and the reference value $r_{0001}$ is stored in the register 4b. A metric $ms_{1000}$ between the equalized signal $u_{n-1}$ and the reference value $r_{1000}$ is stored in the register 4c. A metric $ms_{1001}$ between the equalized signal $u_{n-1}$ and the reference value $r_{1001}$ is stored in the register 4d. A metric $ms_{0011}$ between the equalized signal $u_{n-1}$ and the reference value $r_{0011}$ is stored in the register 4e.

A metric $ms_{1100}$ between the equalized signal $u_{n-1}$ and the reference value $r_{1100}$ is stored in the register 4f. A metric $ms_{0110}$ between the equalized signal $u_{n-1}$ and the reference value $r_{0110}$ is stored in the register 4g. A metric $ms_{0111}$ between the equalized signal $u_{n-1}$ and the reference value $r_{0111}$ is stored in the register 4h. A metric $ms_{1110}$ between the equalized signal $u_{n-1}$ and the reference value $r_{1110}$ is stored in the register 4i. A metric $ms_{1111}$ between the equalized signal $u_{n-1}$ and the reference value $r_{1111}$ is stored in the register 4j.

Adders 41 and multipliers 42 are provided between the registers 4A and 4a, the registers 4B and 4b, the registers 4C and 4c, the registers 4D and 4d, the registers 4E and 4e, the registers 4F and 4f, the registers 4G and 4g, the registers 4H and 4h, the registers 4I and 4i, and the registers 4J and 4j, respectively.

The adders 41 receive the equalized signal $u_{n-1}$ and the reference signals $r_{0000}$, $r_{0001}$, $r_{1000}$, $r_{1001}$, $r_{0011}$, $r_{1100}$, $r_{0110}$, $r_{0111}$, $r_{1110}$, and $r_{1111}$ obtained from the registers 4A to 4J, respectively, and output error signals thereof. Also, the multipliers 42 square the error signals output from the respective adders 41, so as to output the generated signals. Absolute-value calculators may be used instead of the multipliers 42.

In this way, the values in the registers 4a to 4j are output at every channel bit clock.

Figure 5:
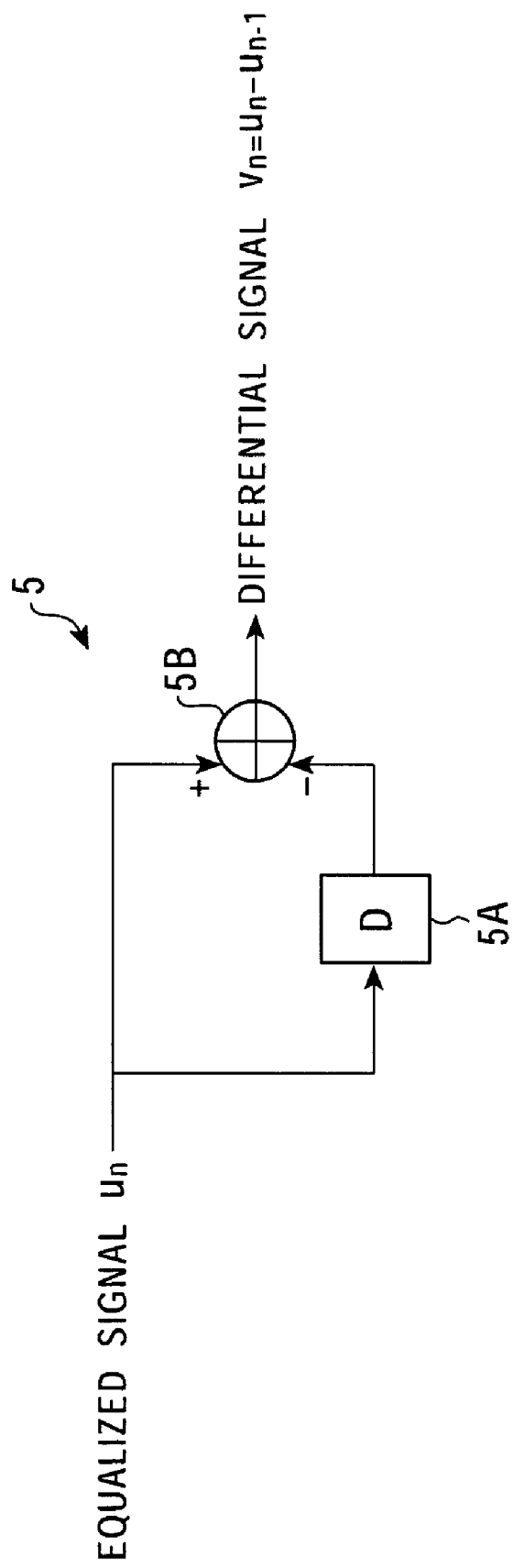
FIG. 5 is a block diagram showing an example of the configuration of a differential-signal generator of a second-metric generator in the maximum likelihood decoder shown in FIG. 2.
Figure 6:
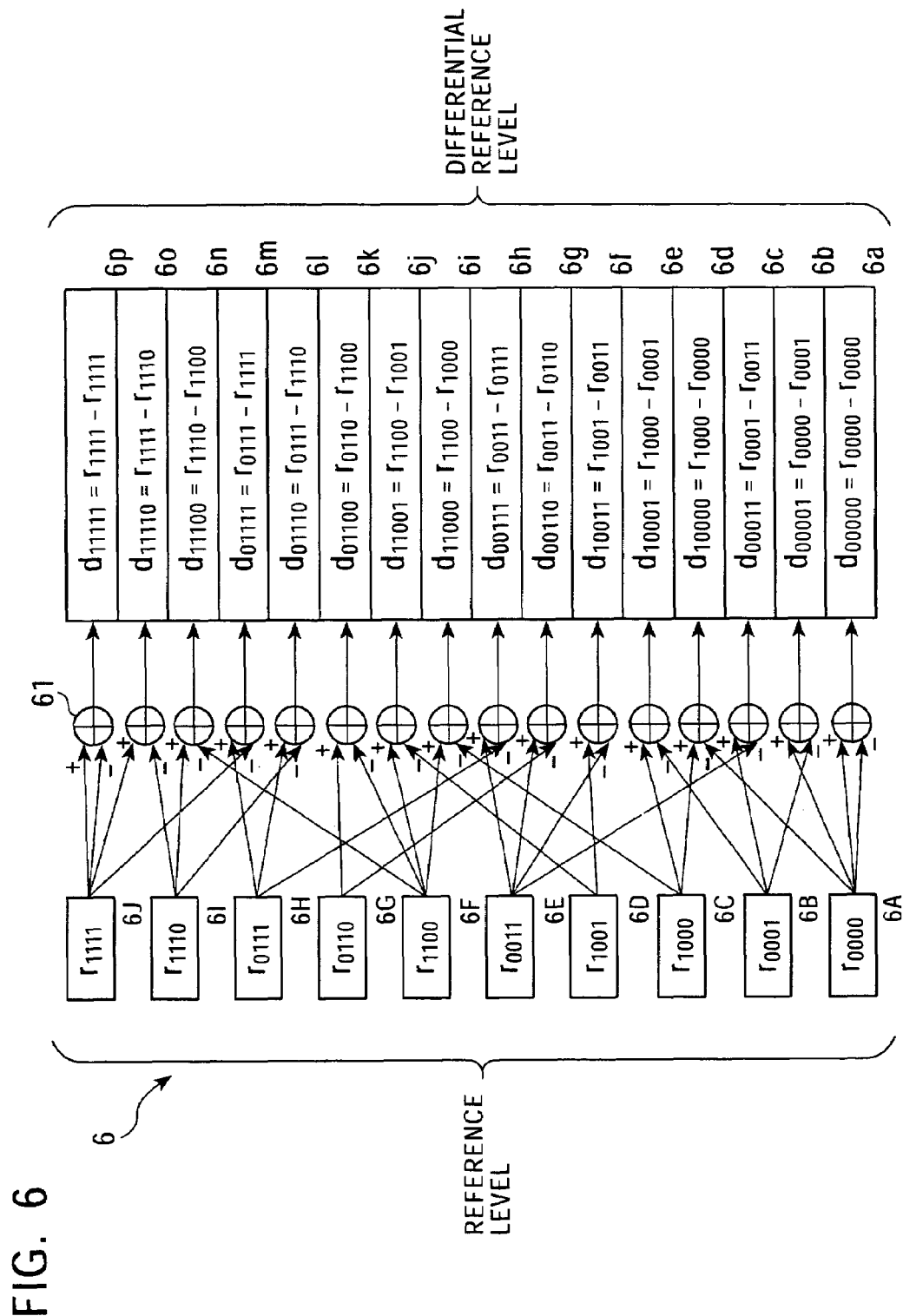
FIG. 6 is a block diagram showing an example of the configuration of a differential-reference-value generator of the second-metric generator in the maximum likelihood decoder shown in FIG. 2.
Figure 7:
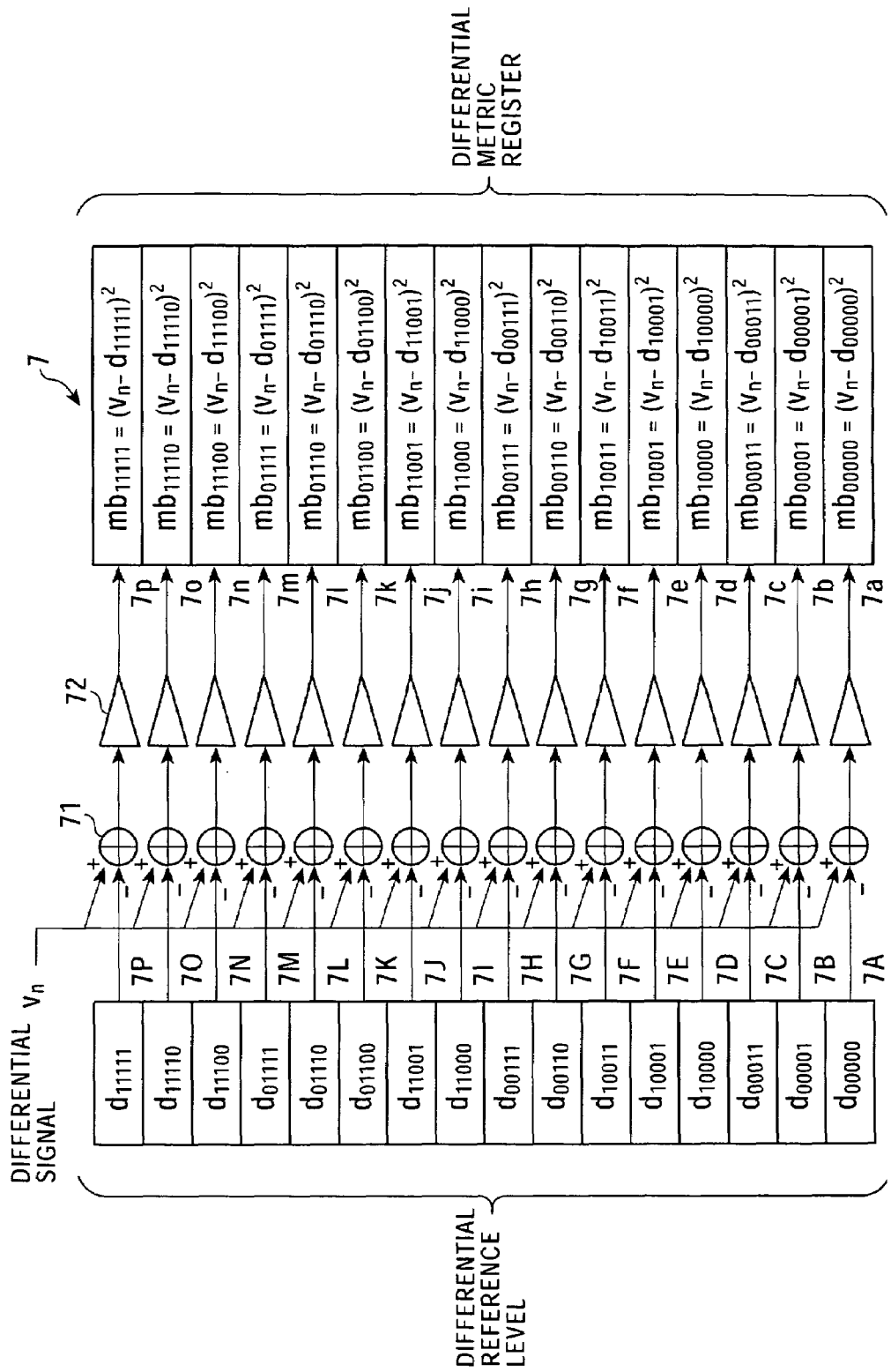
FIG. 7 is a block diagram showing an example of the configuration of a differential-metric generator of the second-metric generator in the maximum likelihood decoder shown in FIG. 2.

FIGS. 5 to 7 are block diagrams showing an example of the configuration of the second-metric generator 2C.

The second-metric generator 2C includes a differential-signal generator 5 shown in FIG. 5; a differential-reference-value generator 6 shown in FIG. 6; and a differential-metric generator 7 shown in FIG. 7.

The differential-signal generator 5 shown in FIG. 5 includes a flip-flop 5A and an adder 5B.

The equalized signal $u_n$ input to the differential-signal generator 5 is input to the flip-flop 5A. The flip-flop 5A delays the equalized signal $u_n$ by a channel bit clock and outputs an equalized signal $u_{n-1}$.

The equalized signal $u_n$ input to the differential-signal generator 5 and the delayed equalized signal $u_{n-1}$ are input to the adder 5B. The adder 5B outputs a differential signal $v_n = u_n - u_{n-1}$. In this way, the reproduced signal is equalized to the partial response PR (a b–a 0 a–b –a).

The differential-reference-value generator 6 shown in FIG. 6 includes registers 6A to 6J and registers 6a to 6p.

The register 6A stores the reference value $r_{0000}$, equal to the value in the register 4A. The register 6B stores the reference value $r_{0001}$, equal to the value in the register 4B. The register 6C stores the reference value $r_{1000}$, equal to the value in the register 4C. The register 6D stores the reference value $r_{1001}$, equal to the value in the register 4D. The register 6E stores the reference value $r_{0011}$, equal to the value in the register 4E. The register 6F stores the reference value $r_{1100}$, equal to the value in the register 4F. The register 6G stores the reference value $r_{0110}$, equal to the value in the register 4G. The register 6H stores the reference value $r_{0111}$, equal to the value in the register 4H. The register 6I stores the reference value $r_{1110}$, equal to the value in the register 4I. The register 6J stores the reference value $r_{1111}$, equal to the value in the register 4J.

Also, adders 61 for obtaining differential reference values are provided between the registers 6A to 6J and the registers 6a to 6p.

The register 6a stores a differential reference value $d_{00000} = r_{0000} - r_{0000}$. The register 6b stores a differential reference value $d_{00001} = r_{0000} - r_{0001}$. The register 6c stores a differential reference value $d_{00011} = r_{0001} - r_{0011}$. The register 6d stores a differential reference value $d_{10000} = r_{1000} - r_{0000}$. The register 6e stores a differential reference value $d_{10001} = r_{1000} - r_{0001}$. The register 6f stores a differential reference value $d_{10011} = r_{1001} - r_{0011}$. The register 6g stores a differential reference value $d_{00110} = r_{0011} - r_{0110}$. The register 6h stores a differential reference value $d_{00111} = r_{0011} - r_{0111}$. The register 6i stores a differential reference value $d_{11000} = r_{1100} - r_{1000}$.

The register 6j stores a differential reference value $d_{11001} = r_{1100} - r_{1001}$. The register 6k stores a differential reference value $d_{01100} = r_{0110} - r_{1100}$. The register 6l stores a differential reference value $d_{01110} = r_{0111} - r_{1110}$. The register 6m stores a differential reference value $d_{01111} = r_{0111} - r_{1111}$. The register 6n stores a differential reference value $d_{11100} = r_{1110} - r_{1100}$. The register 6o stores a differential reference value $d_{11110} = r_{1111} - r_{1110}$. The register 6p stores a differential reference value $d_{11111} = r_{1111} - r_{1111}$.

In this way, reference levels of the partial response PR (a b–a 0 a–b –a) are generated.

The differential metric generator 7 shown in FIG. 7 includes reference-value registers 7A to 7P and differential metric registers 7a to 7p.

The register 7A stores the differential reference value $d_{00000}$ of the register 6a. The register 7B stores the differential reference value $d_{00001}$ of the register 6b. The register 7C stores the differential reference value $d_{00011}$ of the register 6c. The register 7D stores the differential reference value $d_{10000}$ of the register 6d. The register 7E stores the differential reference value $d_{10001}$ of the register 6e. The register 7F stores the differential reference value $d_{10011}$ of the register 6f. The register 7G stores the differential reference value $d_{00110}$ of the register 6g. The register 7H stores the differential reference value $d_{00111}$ of the register 6h.

The register 7I stores the differential reference value $d_{11000}$ of the register 6i. The register 7J stores the differential reference value $d_{11001}$ of the register 6j. The register 7K stores the differential reference value $d_{01100}$ of the register 6k. The register 7L stores the differential reference value $d_{01110}$ of the register 6l. The register 7M stores the differential reference value $d_{01111}$ of the register 6m. The register 7N stores the differential reference value $d_{11100}$ of the register 6n. The register 7O stores the differential reference value $d_{11110}$ of the register 6o. The register 7P stores the differential reference value $d_{11111}$ of the register 6p.

Also, the register 7a stores a metric $mb_{00000}$ between the differential signal $v_n$ and the differential reference value $d_{00000}$. The register 7b stores a metric $mb_{00001}$ between the differential signal $v_n$ and the differential reference value $d_{00001}$. The register 7c stores a metric $mb_{00011}$ between the differential signal $v_n$ and the differential reference value $d_{00011}$. The register 7d stores a metric $mb_{10000}$ between the differential signal $v_n$ and the differential reference value $d_{10000}$. The register 7e stores a metric $mb_{10001}$ between the differential signal $v_n$ and the differential reference value $d_{10001}$. The register 7f stores a metric $mb_{10011}$ between the differential signal $v_n$ and the differential reference value $d_{10011}$. The register 7g stores a metric $mb_{00110}$ between the differential signal $v_n$ and the differential reference value $d_{00110}$. The register 7h stores a metric $mb_{00111}$ between the differential signal $v_n$ and the differential reference value $d_{00111}$.

The register 7i stores a metric $mb_{11000}$ between the differential signal $v_n$ and the differential reference value $d_{11000}$. The register 7j stores a metric $mb_{11001}$ between the differential signal $v_n$ and the differential reference value $d_{11001}$. The register 7k stores a metric $mb_{01100}$ between the differential signal $v_n$ and the differential reference value $d_{01100}$. The register 7l stores a metric $mb_{01110}$ between the differential signal $v_n$ and the differential reference value $d_{01110}$. The register 7m stores a metric $mb_{01111}$ between the differential signal $v_n$ and the differential reference value $d_{01111}$. The register 7n stores a metric $mb_{11100}$ between the differential signal $v_n$ and the differential reference value $d_{11100}$. The register 7o stores a metric $mb_{11110}$ between the differential signal $v_n$ and the differential reference value $d_{11110}$. The register 7p stores a metric $mb_{11111}$ between the differential signal $v_n$ and the differential reference value $d_{11111}$.

Adders 71 and multipliers 72 are provided between the registers 7A and 7a, the registers 7B and 7b, the registers 7C and 7c, the registers 7D and 7d, the registers 7E and 7e, the registers 7F and 7f, the registers 7G and 7g, the registers 7H and 7h, the registers 7I and 7i, the registers 7J and 7j, the registers 7K and 7k, the registers 7L and 7l, the registers 7M and 7m, the registers 7N and 7n, the registers 7O and 7o, and the registers 7P and 7p, respectively.

The adders 71 receive the differential signal $v_n$ and the reference values $d_{00000}$, $d_{00001}$, $d_{00011}$, $d_{10000}$, $d_{10001}$, $d_{10011}$, $d_{00110}$, $d_{00111}$, $d_{11000}$, $d_{11001}$, $d_{01100}$, $d_{01110}$, $d_{01111}$, $d_{11100}$, $d_{11110}$, and $d_{11111}$ in the registers 7A to 7P, respectively, and output error signals thereof. Also, the multipliers 72 square the error signals output from the respective adders 71 and output the generated signals. Absolute-value calculators may be used instead of the multipliers 72.

In this way, the values in the registers 7a to 7p are output at every channel bit clock.

FIG. 8 is a block diagram showing an example of the configuration of the metric synthesizer 2D.

The metric synthesizer 2D receives 10 metrics (ms) output from the registers 4a to 4j of the first-metric generator 2B and 16 metrics (mb) output from the registers 7a to 7p of the second-metric generator 2C, and outputs 16 metrics (mp) obtained from registers 8A to 8P.

The first metric $ms_{0000}$ and the second metric $mb_{00000}$ are input to the register 8A, which generates a synthetic metric $mp_{00000} = ms_{0000} + k*mb_{00000}$ by using a predetermined constant k as coefficient and stores the synthetic metric. The first metric $ms_{0000}$ and the second metric $mb_{00001}$ are input to the register 8B, which generates a synthetic metric $mp_{00001} = ms_{0000} + k*mb_{00001}$ by using the predetermined constant k as coefficient and stores the synthetic metric. The first metric $ms_{0001}$ and the second metric $mb_{00011}$ are input to the register 8C, which generates a synthetic metric $mp_{00011} = ms_{0001} + k*mb_{00011}$ by using the predetermined constant k as coefficient and stores the synthetic metric.

The first metric $ms_{1000}$ and the second metric $mb_{10000}$ are input to the register 8D, which generates a synthetic metric $mp_{10000} = ms_{1000} + k*mb_{10000}$ by using the predetermined constant k as coefficient and stores the synthetic metric. The first metric $ms_{1000}$ and the second metric $mb_{10001}$ are input to the register 8E, which generates a synthetic metric $mp_{10001} = ms_{1000} + k*mb_{10001}$ by using the predetermined constant k as coefficient and stores the synthetic metric. The first metric $ms_{1001}$ and the second metric $mb_{10011}$ are input to the register 8F, which generates a synthetic metric $mp_{10011} = ms_{1001} + k*mb_{10011}$ by using the predetermined constant k as coefficient and stores the synthetic metric.

The first metric $ms_{0011}$ and the second metric $mb_{00110}$ are input to the register 8G, which generates a synthetic metric $mp_{00110} = ms_{0011} + k*mb_{00110}$ by using the predetermined constant k as coefficient and stores the synthetic metric. The first metric $ms_{0011}$ and the second metric $mb_{00111}$ are input to the register 8H, which generates a synthetic metric $mp_{00111} = ms_{0011} + k*mb_{00111}$ by using the predetermined constant k as coefficient and stores the synthetic metric. The first metric $ms_{1100}$ and the second metric $mb_{11000}$ are input to the register 8I, which generates a synthetic metric $mp_{11000} = ms_{1100} + k*mb_{11000}$ by using the predetermined constant k as coefficient and stores the synthetic metric.

The first metric $ms_{1100}$ and the second metric $mb_{11001}$ are input to the register 8J, which generates a synthetic metric $mp_{11001} = ms_{1100} + k*mb_{11001}$ by using the predetermined constant k as coefficient and stores the synthetic metric. The first metric $ms_{0110}$ and the second metric $mb_{01100}$ are input to the register 8K, which generates a synthetic metric $mp_{01100} = ms_{0110} + k*mb_{01100}$ by using the predetermined constant k as coefficient and stores the synthetic metric. The first metric $ms_{0111}$ and the second metric $mb_{01110}$ are input to the register 8L, which generates a synthetic metric $mp_{01110} = ms_{0111} + k*mb_{01110}$ by using the predetermined constant k as coefficient and stores the synthetic metric.

The first metric $ms_{0111}$ and the second metric $mb_{01111}$ are input to the register 8M, which generates a synthetic metric $mp_{01111} = ms_{0111} + k*mb_{01111}$ by using the predetermined constant k as coefficient and stores the synthetic metric. The first metric $ms_{1110}$ and the second metric $mb_{11100}$ are input to the register 8N, which generates a synthetic metric $mp_{11100} = ms_{1110} + k*mb_{11100}$ by using the predetermined constant k as coefficient and stores the synthetic metric.

The first metric $ms_{1111}$ and the second metric $mb_{11110}$ are input to the register 8O, which generates a synthetic metric $mp_{11110} = ms_{1111} + k*mb_{11110}$ by using the predetermined constant k as coefficient and stores the synthetic metric. The first metric $ms_{1111}$ and the second metric $mb_{11111}$ are input to the register 8P, which generates a synthetic metric $mp_{11111} = ms_{1111} + k*mb_{11111}$ by using the predetermined constant k as coefficient and stores the synthetic metric.

In this way, the metric values in the registers 8A to 8P are output at every channel bit clock.

Figure 9:
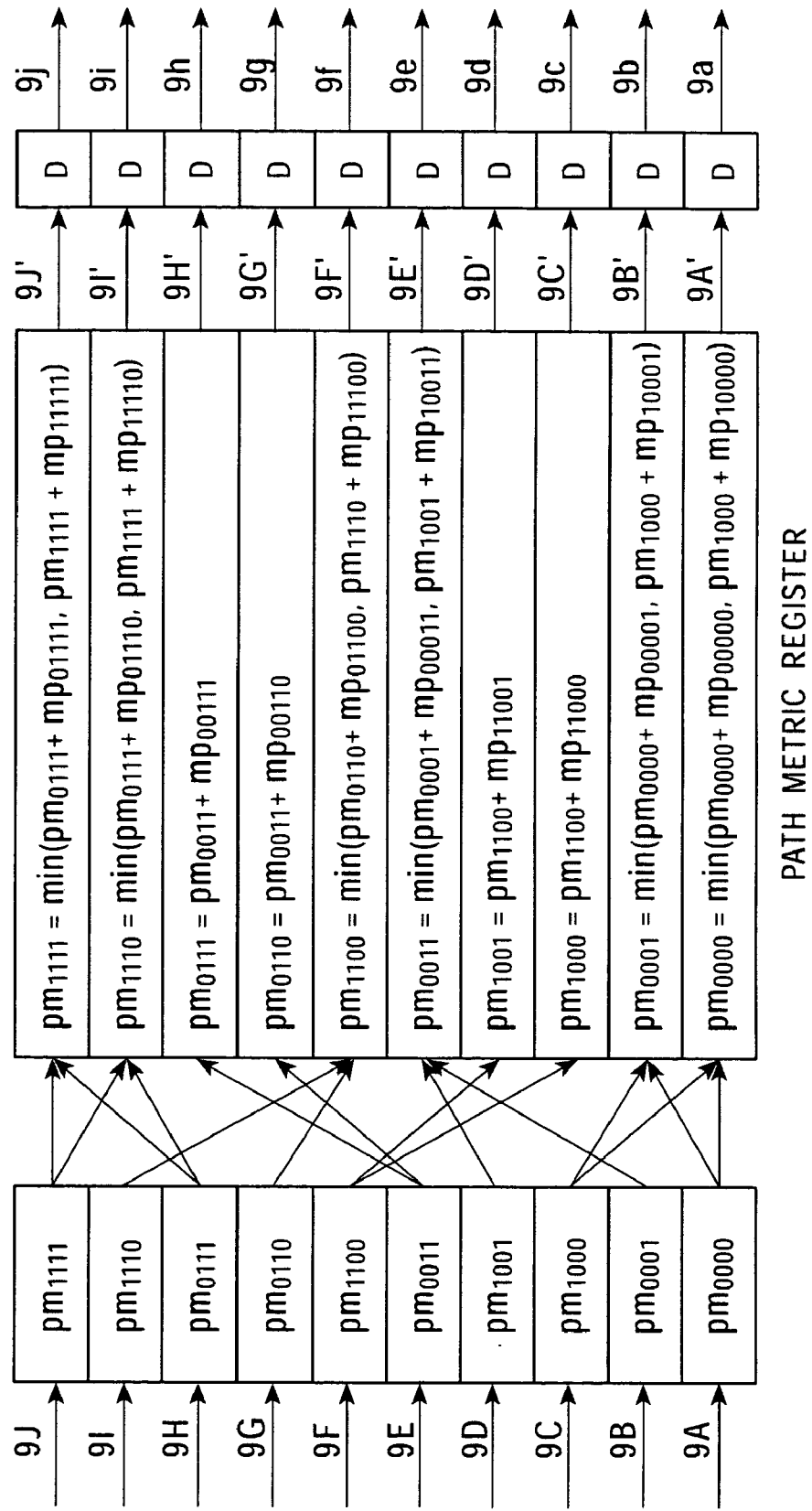
FIG. 9 is a block diagram showing an example of the configuration of a path metric updating device of a Viterbi decoder in the maximum likelihood decoder shown in FIG. 2.
Figure 10:
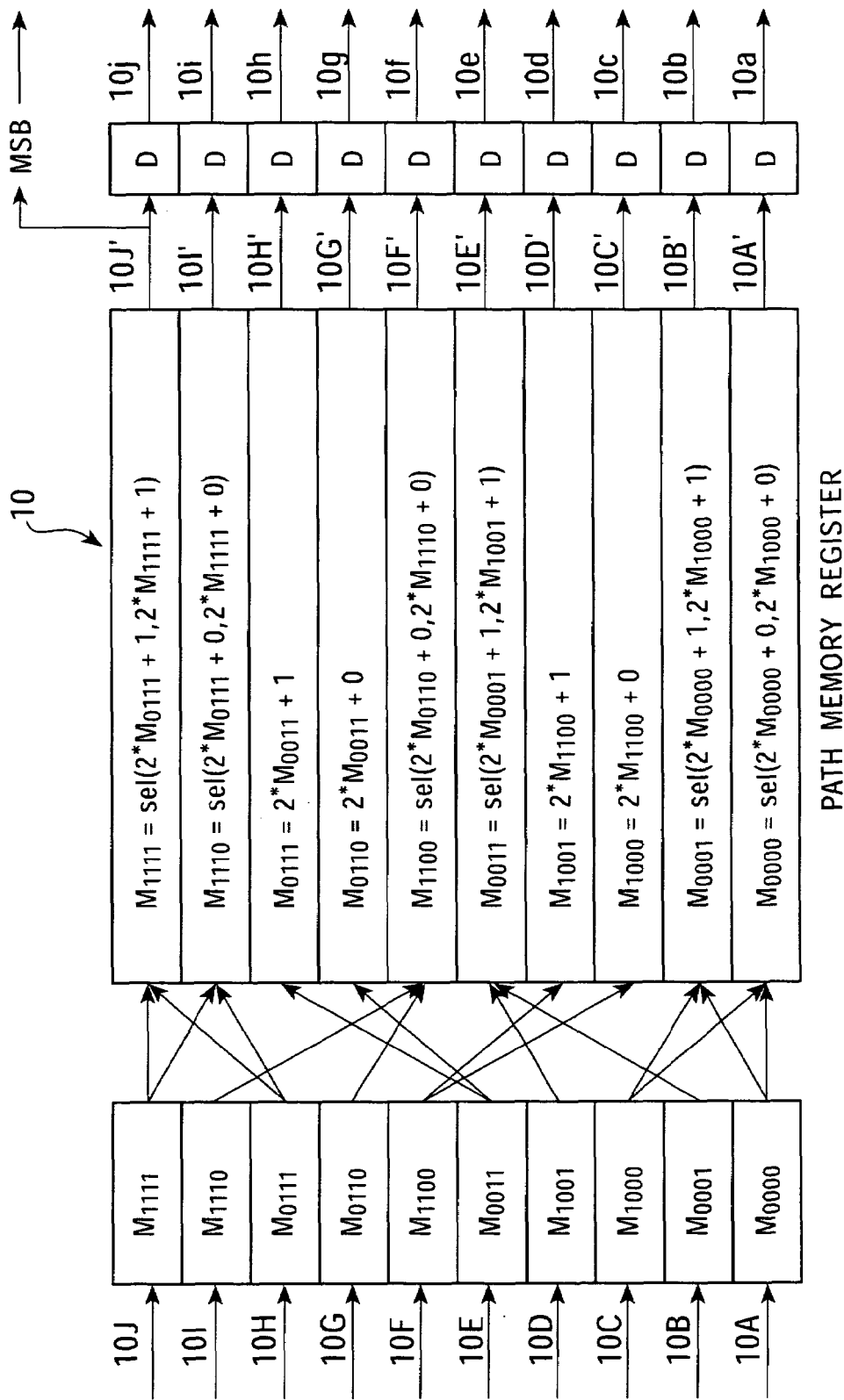
FIG. 10 is a block diagram showing an example of the configuration of a path memory updating device of the Viterbi decoder in the maximum likelihood decoder shown in FIG. 2.

FIGS. 9 and 10 are block diagrams showing an example of the configuration of the Viterbi decoder 2E.

The Viterbi decoder 2E includes a path metric updating device 9 shown in FIG. 9 and a path memory updating device 10 shown in FIG. 10.

As shown in FIG. 9, the path metric updating device 9 includes path metric registers 9A to 9J and 9A' to 9J' and flip-flops 9a to 9j.

The register 9A stores a path metric $pm_{0000}$ of a survival path in a state $S_{0000}$. In the register 9A', the smaller value is selected from among path metrics $pm_{00000} = pm_{0000} + mp_{00000}$ and $pm_{10000} = pm_{1000} + mp_{10000}$ of the paths to the state $S_{0000}$. Herein, the metrics $mp_{00000}$ and $mp_{10000}$ used for calculating the path metrics are input from the metric synthesizer 2D. The value of the register 9A' is latched by the flip-flop 9a and is stored as the value of the register 9A.

The register 9B stores a path metric $pm_{0001}$ of a survival path in a state $s_{0001}$. In the register 9B', the smaller value is selected from among path metrics $pm_{00001} = pm_{0000} + mp_{00001}$ and $pm_{10001} = pm_{1000} + mp_{10001}$ of the paths to the state $S_{0001}$. Herein, the metrics $mp_{00001}$ and $mp_{10001}$ used for calculating the path metrics are input from the metric synthesizer 2D. The value of the register 9B' is latched by the flip-flop 9b and is stored as the value of the register 9B.

The register 9C stores a path metric $pm_{1000}$ of a survival path in a state $s_{1000}$. The register 9C' stores a path metric $pm_{11000} = pm_{1100} + mp_{11000}$ of the path to the state $S_{1000}$. The metric $mp_{11000}$ used for calculating the path metric is input from the metric synthesizer 2D. The value of the register 9C' is latched by the flip-flop 9c and is stored as the value of the register 9C.

The register 9D stores a path metric $pm_{1001}$ of a survival path in a state $s_{1001}$. The register 9D' stores a path metric $pm_{11001} = pm_{1100} + mp_{11001}$ of the path to the state $S_{1001}$. The metric $mp_{11001}$ used for calculating the path metric is input from the metric synthesizer 2D. The value of the register 9D' is latched by the flip-flop 9d and is stored as the value of the register 9D.

The register 9E stores a path metric $pm_{0011}$ of a survival path in a state $s_{0011}$. In the register 9E', the smaller value is selected from among path metrics $pm_{00011} = pm_{0001} + mp_{00011}$ and $pm_{10011} = pm_{1001} + mp_{10011}$ of the paths to the state $S_{0011}$. Herein, the metrics $mp_{00011}$ and $mp_{10011}$ used for calculating the path metrics are input from the metric synthesizer 2D. The value of the register 9E' is latched by the flip-flop 9e and is stored as the value of the register 9E.

The register 9F stores a path metric $pm_{1100}$ of a survival path in a state $s_{1100}$. In the register 9F', the smaller value is selected from among path metrics $pm_{01100}=pm_{0110}+mp_{01100}$ and $pm_{11100}=pm_{1110}+mp_{11100}$ of the paths to the state $S_{1100}$. Herein, the metrics $mp_{01100}$ and $mp_{11100}$ used for calculating the path metrics are input from the metric synthesizer 2D. The value of the register 9F' is latched by the flip-flop 9f and is stored as the value of the register 9F.

The register 9G stores a path metric $pm_{0110}$ of a survival path in a state $s_{0110}$. The register 9G' stores a path metric $pm_{00110}=pm_{0011}+mp_{00110}$ of the path to the state $S_{0110}$. The metric $mp_{00110}$ used for calculating the path metric is input from the metric synthesizer 2D. The value of the register 9G' is latched by the flip-flop 9g and is stored as the value of the register 9G.

The register 9H stores a path metric $pm_{0111}$ of a survival path in a state $s_{0111}$. The register 9H' stores a path metric $pm_{00111}=pm_{0011}+mp_{00111}$ of the path to the state $S_{0111}$. The metric $mp_{00111}$ used for calculating the path metric is input from the metric synthesizer 2D. The value of the register 9H' is latched by the flip-flop 9h and is stored as the value of the register 9H.

The register 9I stores a path metric $pm_{1110}$ of a survival path in a state $s_{1110}$. In the register 9I', the smaller value is selected from among path metrics $pm_{01110}=pm_{0111}+mp_{01110}$ and $pm_{11110}=pm_{1111}+mp_{11110}$ of the paths to the state $S_{1110}$. Herein, the metrics $mp_{01110}$ and $mp_{11110}$ used for calculating the path metrics are input from the metric synthesizer 2D. The value of the register 9I' is latched by the flip-flop 9i and is stored as the value of the register 9I.

The register 9J stores a path metric $pm_{1111}$ of a survival path in a state $s_{1111}$. In the register 9J', the smaller value is selected from among path metrics $pm_{01111}=pm_{0111}+mp_{01111}$ and $pm_{11111}=pm_{1111}+mp_{11111}$ of the paths to the state $S_{1111}$. Herein, the metrics $mp_{01111}$ and $mp_{11111}$ used for calculating the path metrics are input from the metric synthesizer 2D. The value of the register 9J' is latched by the flip-flop 9j and is stored as the value of the register 9J.

As shown in FIG. 10, the path memory updating device 10 includes path memory registers 10A to 10J and 10A' to 10J' and flip-flops 10a to 10j.

The register 10A stores a path memory $M_{0000}$ of the survival path in the state $s_{0000}$. In the register 10A', a path memory of the path having a smaller path metric is selected from among pass memories $M_{0000}$ and $M_{1000}$ of the two paths to the state $s_{0000}$. The selected memory value is doubled and 0 is added thereto. The value of the register 10A' is latched by the flip-flop 10a and is stored as the value of the register 10A.

The register 10B stores a path memory $M_{0001}$ of the survival path in the state $s_{0001}$. In the register 10B', a path memory of the path having a smaller path metric is selected from among pass memories $M_{0000}$ and $M_{1000}$ of the two paths to the state $s_{0001}$. The selected memory value is doubled and 0 is added thereto. The value of the register 10B' is latched by the flip-flop 10b and is stored as the value of the register 10B.

The register 10C stores a path memory $M_{1000}$ of the survival path in the state $s_{1000}$. In the register 10C', a path memory $M_{1100}$ of the path to the state $s_{1000}$ is doubled and 0 is added thereto. The value of the register 10C' is latched by the flip-flop 10c and is stored as the value of the register 10C.

The register 10D stores a path memory $M_{1001}$ of the survival path in the state $s_{1001}$. In the register 10D', a path memory $M_{1100}$ of the path to the state $s_{1001}$ is doubled and 1 is added thereto. The value of the register 10D' is latched by the flip-flop 10d and is stored as the value of the register 10D.

The register 10E stores a path memory $M_{0011}$ of the survival path in the state $s_{0011}$. In the register 10E', a path memory of the path having a smaller path metric is selected from among pass memories $M_{0001}$ and $M_{1001}$ of the two paths to the state $s_{0011}$. The selected memory value is doubled and 1 is added thereto. The value of the register 10E' is latched by the flip-flop 10e and is stored as the value of the register 10E.

The register 10F stores a path memory $M_{1100}$ of the survival path in the state $s_{1100}$. In the register 10F', a path memory of the path having a smaller path metric is selected from among pass memories $M_{0110}$ and $M_{1110}$ of the two paths to the state $s_{1100}$. The selected memory value is doubled and 0 is added thereto. The value of the register 10F' is latched by the flip-flop 10f and is stored as the value of the register 10F.

The register 10G stores a path memory $M_{0110}$ of the survival path in the state $s_{0110}$. In the register 10G', a path memory $M_{0011}$ of the path to the state $s_{0110}$ is doubled and 0 is added thereto. The value of the register 10G' is latched by the flip-flop 10g and is stored as the value of the register 10G.

The register 10H stores a path memory $M_{0111}$ of the survival path in the state $s_{0111}$. In the register 10H', a path memory $M_{0011}$ of the path to the state $s_{0111}$ is doubled and 1 is added thereto. The value of the register 10H' is latched by the flip-flop 10h and is stored as the value of the register 10H.

The register 10I stores a path memory $M_{1110}$ of the survival path in the state $s_{1110}$. In the register 10I', a path memory of the path having a smaller path metric is selected from among pass memories $M_{0111}$ and $M_{1111}$ of the two paths to the state $s_{1110}$. The selected memory value is doubled and 0 is added thereto. The value of the register 10I' is latched by the flip-flop 10i and is stored as the value of the register 10I.

The register 10J stores a path memory $M_{1111}$ of the survival path in the state $s_{1111}$. In the register 10J', a path memory of the path having a smaller path metric is selected from among pass memories $M_{0111}$ and $M_{1111}$ of the two paths to the state $s_{1111}$. The selected memory value is doubled and 1 is added thereto. The value of the register 10J' is latched by the flip-flop 10j and is stored as the value of the register 10J.

The most significant bit (MSB) of any of the path memory registers 10A' to 10J' of the path memory updating device 10 is externally output as decoded data.

As a result, decoded bit information is output from the Viterbi decoder 2E.

In the above-described embodiment, a reference value includes a 4-bit partial response. However, the reference value may include a partial response of less than 4 bits. Alternatively, the reference value may include a partial response of more than 4 bits.

Further, the reference values in the embodiment may be applied by a learning type table, in which a sampling level is adaptively fed back in accordance with decoded data.

Figure 11:
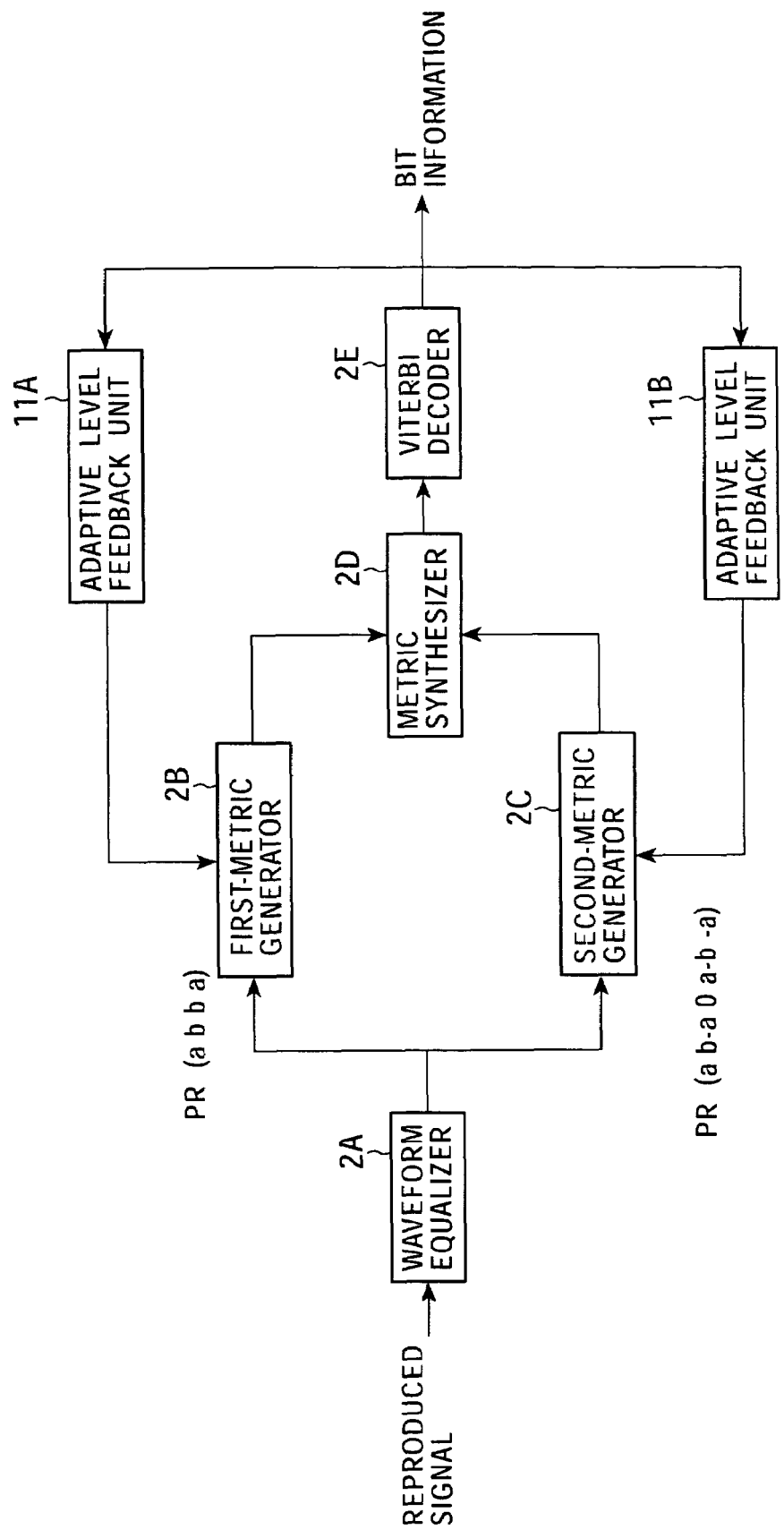
FIG. 11 is a block diagram showing an example of the configuration according to a modification of the maximum likelihood decoder shown in FIG. 2, in which an adaptive table is used.
Figure 12:
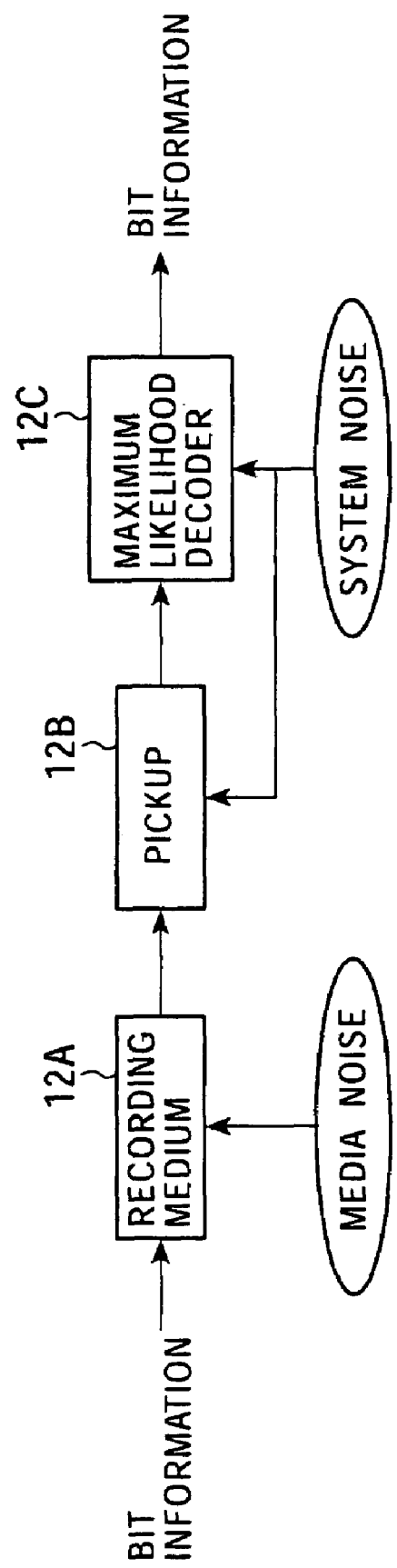
FIG. 12 is a block diagram showing noise generated in a known recording/reproducing system.
Figure 13A:
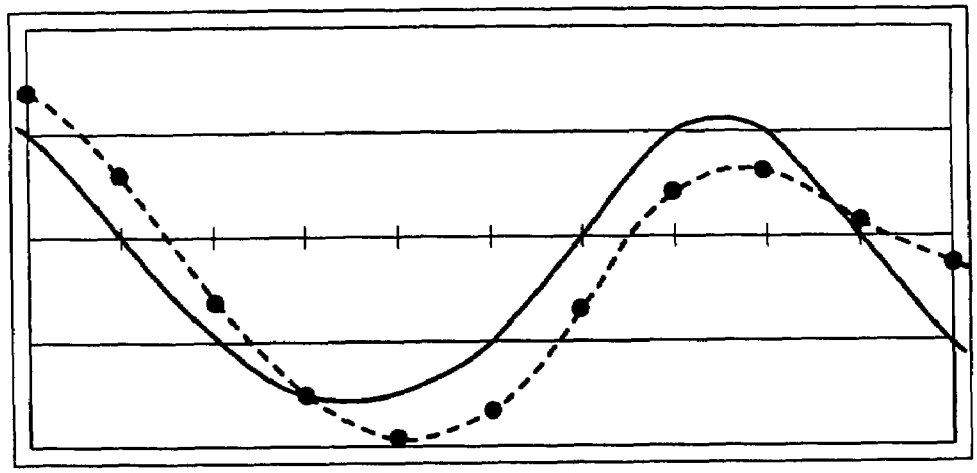
FIGS. 13A and 13B show waveforms of a signal containing media noise and a signal containing system noise of a reproduced signal in the recording/reproducing system shown in FIG. 12.
Figure 13B:
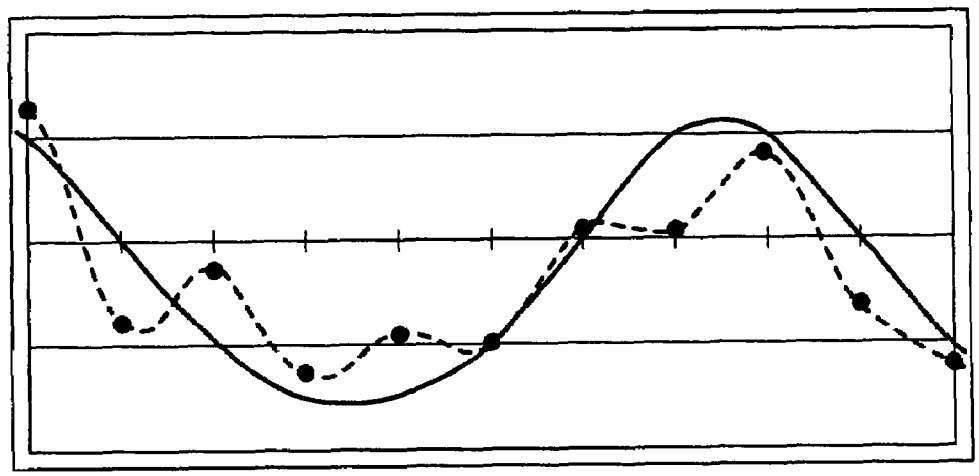

FIG. 11 is a block diagram showing an example of the configuration of the maximum likelihood decoder 1D in which the adaptive table is used.

In the decoder 1D shown in FIG. 11, the waveform equalizer 2A, the first-metric generator 2B, the second-metric generator 2C, the metric synthesizer 2D, and the Viterbi decoder 2E are common with the configuration shown in FIG. 2. In FIG. 11, however, decoded data output from the Viterbi decoder 2E is input to adaptive level feedback units 11A and 11B, reference values according to the decoded data are found by the internal tables of the adaptive level feedback units 11A and 11B, and the reference values are fed back to the first-metric generator 2B and the second-metric generator 2C, respectively, so that the reference values are reflected to generation of metrics.

In the above-described embodiment, the present invention is applied to a reproducing system for optical-disk-type recording media. However, the present invention can be widely applied to various systems correlated with noise, such as a system for reproducing magnetic disks and a system to which similar reproduced signals are input through a network or the like.

As described above, according to the maximum likelihood decoding method and the maximum likelihood decoder of the present invention, a metric between a reproduced signal generated based on a first partial response and a reference value generated based on the first partial response is generated. Also, a metric between a reproduced signal generated based on a second partial response and a reference value generated based on the second partial response is generated. By using a synthetic metric generated by combining these two metrics at a predetermined ratio, maximum likelihood decoding can be realized while effectively controlling various types of noise having different characteristics.

What is claimed is:

1. A maximum likelihood decoding method for obtaining original information by decoding a reproduced signal from a recording medium or a reproduced signal obtained through a transmission medium, the method comprising:
   a first-metric generating step for generating a metric of a reproduced signal generated based on a first partial response, the metric being a first metric;
   a second-metric generating step for generating a metric of a reproduced signal generated based on a second partial response, the metric being a second metric; and
   a maximum likelihood decoding step for realizing maximum likelihood decoding by using the first metric and the second metric,
   wherein the second partial response is a differential partial response obtained by calculating a difference between the first partial response and a response generated by shifting the first partial response by 1 channel clock.

2. The method according to claim 1, wherein the first partial response has a predetermined frequency characteristic which can be realized by adjusting a frequency characteristic of a channel for generating a reproduced signal based on a data signal.

3. The method according to claim 1, wherein the first partial response is generated by equalizing a reproduced signal, which is reproduced by transferring a data signal, by using a waveform equalizer.

4. The method according to claim 1, wherein, in the first-metric generating step, the first metric is generated by calculating a metric between a reproduced signal generated by equalizing a reproduced data signal to the first partial response and a reference signal obtained by inputting a data sequence which can serve as a decoded data sequence to the first partial response.

5. The method according to claim 1, wherein, in the second-metric generating step, the second metric is generated by calculating a metric between a reproduced signal generated by equalizing a reproduced data signal to the second partial response and a reference signal obtained by inputting a data sequence which can serve as a decoded data sequence to the second partial response.

6. The method according to claim 1, wherein the first metric and the second metric are the square of a difference in an amplitude level between a sample of a reproduced signal generated by reproducing a data signal based on a predetermined partial response and a sample of a reference signal generated by using a data signal which can serve as a decoded data signal based on the partial response.

7. The method according to claim 1, wherein the first metric and the second metric are the absolute value of a difference in an amplitude level between a sample of a reproduced signal generated by reproducing a data signal based on a predetermined partial response and a sample of a reference signal generated by using a data signal which can serve as a decoded data signal based on the partial response.

8. The method according to claim 1, wherein the first metric and the second metric are the function of a difference in an amplitude level between a sample of a reproduced signal generated by reproducing a data signal based on a predetermined partial response and a sample of a reference signal generated by using a data signal which can serve as a decoded data signal based on the partial response.

9. The method according to claim 1, wherein the maximum likelihood decoding step comprises:
   a metric synthesizing step for synthesizing the first metric and the second metric at a predetermined ratio; and
   a Viterbi decoding step for obtaining original data by using the synthetic metric by maximum likelihood decoding.

10. The method according to claim 9, wherein the ratio of the first metric and the second metric is adjusted in accordance with the frequency characteristic of noise contained in a reproduced signal reproduced by transferring a data signal.

11. The method according to claim 1, wherein a Viterbi algorithm is used in the maximum likelihood decoding step, and a data pattern representing states which form the Viterbi algorithm includes data of a number the same as the number required for generating the first partial response.

12. The method according to claim 1, wherein a Viterbi algorithm is used in the maximum likelihood decoding step, and a data pattern representing states which form the Viterbi algorithm includes data of a number smaller by one than the number required for generating the second partial response.

13. The method according to claim 1, wherein a Viterbi algorithm is used in the maximum likelihood decoding step, and a data pattern representing states which form the Viterbi algorithm includes data of a number the same as the number required for generating the second partial response.

14. The method according to claim 1, wherein a Viterbi algorithm is used in the maximum likelihood decoding step, the first metric is defined to each state of Viterbi decoding, and the second metric is defined to each branch of Viterbi decoding.

15. The method according to claim 1, wherein a Viterbi algorithm is used in the maximum likelihood decoding step, and the first metric and the second metric are defined to each branch of Viterbi decoding.

16. The method according to claim 1, wherein a Viterbi algorithm is used in the maximum likelihood decoding step, the first metric is defined to each branch of Viterbi decoding, and the second metric is defined to each state of Viterbi decoding.

17. The method according to claim 1, wherein a Viterbi algorithm is used in the maximum likelihood decoding step, and a survival path to each state has the smallest path metric in paths to each state.

18. The method according to claim 1, wherein a Viterbi algorithm is used in the maximum likelihood decoding step, and the path metric of a path in each state can be obtained by multiplying a metric to the first partial response by a predetermined constant and then adding the result to the path metric of a survival path to each state.

19. The method according to claim 1, wherein a Viterbi algorithm is used in the maximum likelihood decoding step, and the path metric of a path in each branch can be obtained by multiplying a metric to the second partial response by a predetermined constant and then adding the result to the path metric of a survival path to each branch.

20. A maximum likelihood decoder for obtaining original information by decoding a reproduced signal from a recording medium or a reproduced signal obtained through a transmission medium, the decoder comprising:
first-metric generating means for generating a metric of a reproduced signal generated based on a first partial response, the metric being a first metric;
second-metric generating means for generating a metric of a reproduced signal generated based on a second partial response, the metric being a second metric; and
maximum likelihood decoding means for realizing maximum likelihood decoding by using the first metric and the second metric,
wherein the second partial response is a differential partial response obtained by calculating a difference between the first partial response and a response generated by shifting the first partial response by 1 channel clock.

21. The maximum likelihood decoder according to claim 20, wherein the first partial response has a predetermined frequency characteristic which can be realized by adjusting a frequency characteristic of a channel for generating a reproduced signal based on a data signal.

22. The maximum likelihood decoder according to claim 20, further comprising a waveform equalizer for equalizing a reproduced signal, which is reproduced by transferring a data signal, to the first partial response.

23. The maximum likelihood decoder according to claim 20, wherein the first-metric generating means generates the first metric by calculating a metric between a reproduced signal generated by equalizing a reproduced data signal to the first partial response and a reference signal obtained by inputting a data sequence which can serve as a decoded data sequence to the first partial response.

24. The maximum likelihood decoder according to claim 20, wherein the second-metric generating means generates the second metric by calculating a metric between a reproduced signal generated by equalizing a reproduced data signal to the second partial response and a reference signal obtained by inputting a data sequence which can serve as a decoded data sequence to the second partial response.

25. The maximum likelihood decoder according to claim 20, wherein the first metric and the second metric are the square of a difference in an amplitude level between a sample of a reproduced signal generated by reproducing a data signal based on a predetermined partial response and a sample of a reference signal generated by using a data signal which can serve as a decoded data signal based on the partial response.

26. The maximum likelihood decoder according to claim 20, wherein the first metric and the second metric are the absolute value of a difference in an amplitude level between a sample of a reproduced signal generated by reproducing a data signal based on a predetermined partial response and a sample of a reference signal generated by using a data signal which can serve as a decoded data signal based on the partial response.

27. The maximum likelihood decoder according to claim 20, wherein the first metric and the second metric are the function of a difference in an amplitude level between a sample of a reproduced signal generated by reproducing a data signal based on a predetermined partial response and a sample of a reference signal generated by using a data signal which can serve as a decoded data signal based on the partial response.

28. The maximum likelihood decoder according to claim 20, wherein the maximum likelihood decoding means comprises:
metric synthesizing means for synthesizing the first metric and the second metric at a predetermined ratio; and
Viterbi decoding means for obtaining original data by using the synthetic metric by maximum likelihood decoding.

29. The maximum likelihood decoder according to claim 28, wherein the metric synthesizing means adjusts the ratio of the first metric and the second metric in accordance with the frequency characteristic of noise contained in a reproduced signal reproduced by transferring a data signal.

30. The maximum likelihood decoder according to claim 20, wherein a Viterbi algorithm is used in the maximum likelihood decoding means, and a data pattern representing states which form the Viterbi algorithm includes data of a number the same as the number required for generating the first partial response.

31. The maximum likelihood decoder according to claim 20, wherein a Viterbi algorithm is used in the maximum likelihood decoding means, and a data pattern representing states which form the Viterbi algorithm includes data of a number smaller by one than the number required for generating the second partial response.

32. The maximum likelihood decoder according to claim 20, wherein a Viterbi algorithm is used in the maximum likelihood decoding means, and a data pattern representing states which form the Viterbi algorithm includes data of a number the same as the number required for generating the second partial response.

33. The maximum likelihood decoder according to claim 20, wherein a Viterbi algorithm is used in the maximum likelihood decoding means, the first metric is defined to each state of Viterbi decoding, and the second metric is defined to each branch of Viterbi decoding.

34. The maximum likelihood decoder according to claim 20, wherein a Viterbi algorithm is used in the maximum likelihood decoding means, and the first metric and the second metric are defined to each branch of Viterbi decoding.

35. The maximum likelihood decoder according to claim 20, wherein a Viterbi algorithm is used in the maximum likelihood decoding means, the first metric is defined to each branch of Viterbi decoding, and the second metric is defined to each state of Viterbi decoding.

36. The maximum likelihood decoder according to claim 20, wherein a Viterbi algorithm is used in the maximum likelihood decoding means, and a survival path to each state has the smallest path metric in paths to each state.

37. The maximum likelihood decoder according to claim 20, wherein a Viterbi algorithm is used in the maximum likelihood decoding means, and the path metric of a path in each state can be obtained by multiplying a metric to the first partial response by a predetermined constant and then adding the result to the path metric of a survival path to each state.

38. The maximum likelihood decoder according to claim 20, wherein a Viterbi algorithm is used in the maximum likelihood decoding means, and the path metric of a path in each branch can be obtained by multiplying a metric to the second partial response by a predetermined constant and then adding the result to the path metric of a survival path to each branch.

* * * * *

UNITED STATES PATENT AND TRADEMARK OFFICE
CERTIFICATE OF CORRECTION

PATENT NO. : 7,302,019 B2
APPLICATION NO. : 10/610931
DATED : November 27, 2007
INVENTOR(S) : Naoki Ide It is certified that error appears in the above-identified patent and that said Letters Patent is hereby corrected as shown below:

Column 12, line 1 change "$mp_{0110}$" to --$mp_{01110}$--

Signed and Sealed this

First Day of July, 2008

JON W. DUDAS
*Director of the United States Patent and Trademark Office*